(12) United States Patent
Furumiya et al.

(10) Patent No.: US 7,053,165 B2
(45) Date of Patent: May 30, 2006

(54) SEMICONDUCTOR INTEGRATED CIRCUIT INCLUDING AN INDUCTOR AND METHOD OF MANUFACTURING THE SAME

(75) Inventors: Masayuki Furumiya, Kanagawa (JP); Ryota Yamamoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 99 days.

(21) Appl. No.: 10/600,104

(22) Filed: Jun. 20, 2003

(65) Prior Publication Data
US 2004/0004266 A1  Jan. 8, 2004

(30) Foreign Application Priority Data
Jun. 24, 2002  (JP) .................................. 2002-183471

(51) Int. Cl.
*H01L 29/00* (2006.01)

(52) U.S. Cl. .................. 527/531; 527/295; 527/425; 527/427; 527/528

(58) Field of Classification Search .................. 257/531, 257/295, 425, 427, 528
See application file for complete search history.

(56) References Cited

U.S. PATENT DOCUMENTS

| | | | | |
|---|---|---|---|---|
| 5,396,101 A | * | 3/1995 | Shiga | .......................... 257/531 |
| 6,114,937 A | | 9/2000 | Burghartz et al. | |
| 6,169,470 B1 | | 1/2001 | Ibata et al. | |
| 6,542,060 B1 | * | 4/2003 | Fedeli | .......................... 336/174 |
| 2002/0050626 A1 | | 5/2002 | Onuma et al. | |
| 2002/0074820 A1 | | 6/2002 | Yue | |

FOREIGN PATENT DOCUMENTS

| | | |
|---|---|---|
| EP | 0 523 450 A1 | 1/1993 |
| EP | 0 702 379 A1 | 3/1996 |
| EP | 0 812 016 A1 | 12/1997 |
| JP | 11-176639 | 7/1999 |
| JP | 2001-284533 | 10/2001 |
| JP | 2002-123915 | 4/2002 |

OTHER PUBLICATIONS

Japanese Patent Office Action of Jun. 7, 2005.

English Translation of the indicated portions of the above-referenced Japanese Patent Office Action.

* cited by examiner

*Primary Examiner*—Minhloan Tran
*Assistant Examiner*—Tan Tran
(74) *Attorney, Agent, or Firm*—Darryl G. Walker; Bradley T. Sako

(57) ABSTRACT

A semiconductor integrated circuit device, and method of manufacturing the same, includes an inductor with improved inductance and an improved quality factor (Q-factor) that can be miniaturized. In one example, an inductor (3) is provided on an insulating layer (2) of a multilayer interconnection layer (1). The inductor (3) is formed by a spiral arrangement of a wiring (3a). A lamination film (14) is provided in an internal region (13) of an inductor (3) on insulating layer (2), and can be formed by laminating a titanium-tungsten (TiW) layer (9), a copper (Cu) layer (10), a ferromagnetic substance layer (15) made of nickel (Ni), a Cu layer (11), and a TiW layer (12), in that order. A lower surface of ferromagnetic substance layer (15) can be lower than an upper surface of wiring layer (3a), and an upper surface of ferromagnetic substance layer (15) can be higher than a lower surface of wiring layer (3a). As a result, a lower portion of ferromagnetic substance layer (15) can be at the same layer (level) as wiring layer (3a). An upper surface of lamination film (14) can be made higher than a wiring layer (3a), and a lower surface of lamination film (14) can be made lower than a lower surface of a wiring layer (3a).

20 Claims, 14 Drawing Sheets

SEMICONDUCTOR INTEGRATED CIRCUIT INCLUDING AN INDUCTOR AND METHOD OF MANUFACTURING THE SAME

TECHNICAL FIELD

The present invention relates generally to a semiconductor integrated circuit that includes an inductor and a method of manufacturing the same, and more particularly to a semiconductor integrated circuit having an inductor with an improved inductance and quality factor (Q-factor), and a method of manufacturing the same.

BACKGROUND OF THE INVENTION

FIG. 14 is a plan view showing a conventional semiconductor integrated circuit. FIG. 15 is a side cross sectional view taken along line E—E shown in FIG. 14. As shown in FIGS. 14 and 15, in a conventional semiconductor integrated circuit, a multilayer interconnection layer 101 can be provided on a semiconductor substrate (not shown). An inductor 103 is a spiral inductor provided on an uppermost layer 102 of the multilayer interconnection layer 101. In more detail, the inductor 103 includes one wiring arranged in a spiral, and formed on an insulating layer 104 of silicon dioxide ($SiO_2$) that is included within multilayer interconnection layer 101. In addition, an insulating layer 105 of $SiO_2$ can be provided to cover inductor 103. Further, an insulating layer 106 of polyimide is provided on insulating layer 105.

It is noted that insulating layers 105 and 106 are omitted from FIG. 14.

A wiring of the inductor 103 is formed with wiring main body 107 of copper or aluminum. The wiring main body 107 has an upper surface and lower surface covered with a titanium-tungsten (TiW) layer 108.

Inductor 103 is provided on an uppermost layer 102 of a multilayer interconnection layer 101 in order to reduce, as much as possible, any parasitic capacitance between the inductor 103 and semiconductor substrate. In addition, a thickness of the wiring of the inductor 103 is increased as much as possible in order to reduce a series resistance for such an inductor 103. Reducing series resistance can improve a quality factor (Q-factor) of the inductor 103.

A conventional semiconductor integrated circuit, like that of FIGS. 14 and 15, can have a number of drawbacks. First, a thickness of an uppermost layer 102 can be about 10 microns ($\mu m$). Thus, when an inductor 103 is included in an uppermost layer 102 of a multilayer interconnection layer 101, such an inductor 103 can have thickness with an upper limit of several microns. Such a limited thickness may result in loss of inductance and an undesirably small Q-factor (about 5 to 10). Second, in order to obtain an inductance of about 10 nano-Henries (nH), a conventional inductor 103 has a spiral shape (vortex) of a square with sides of 200 to 300 $\mu m$. As a result, the area of a conventional inductor 103 can be undesirable large, thus limiting the extent to which a semiconductor conductor integrated circuit can be scaled down in size.

Conventionally, ferromagnetic substance layers have been formed with inductors in particular arrangements.

A conventional technique for providing a layer of a ferromagnetic substance as an upper layer of an inductor is disclosed in Japanese Utility Model Application Publication 3-28758 (JU 3-28758). In JU 3-28758, a ferromagnetic substance layer is provided above a vortex with respect to a vertical position, and within the inner sides of the vortex, with respect to a lateral position.

Japanese Utility Model Application Publication 4-63653 (JU 4-63653) shows another conventional technique in which a ferromagnetic substance layer is provided either above or below an inductor. In JU 4-63653, a ferromagnetic substance layer is provided that covers the inductor when the inductor is viewed perpendicular to the surface of the substrate.

Japanese Patent Application Publication 61-161747 (JP 61-161747) shows another conventional technique in which a ferromagnetic substance layer is provided above an inductor. In JP 61-161747, it is noted that the inclusion of such a ferromagnetic substance layer increases the inductance of the inductor.

However, conventional approaches like those shown above can have drawbacks. In semiconductor integrated circuits with conventional inductors, such as those described in JU 3-28758, JU 4-63653 and JP 61-161747, a Q-factor for a resulting inductor may not be sufficient for certain applications. Thus, in order to arrive at a predetermined inductance, and inductor with a larger area can be required. However, such large area inductors limit the extent to which a semiconductor integrated circuit can be scaled down in size.

In light of the above-mentioned drawbacks, it would be desirable to arrive at a semiconductor integrated circuit, with an inductance and Q-factor that are acceptably high, which is also capable of being miniaturized as the same time. It would also be desirable to arrive at a method of manufacturing such a semiconductor integrated circuit.

SUMMARY OF THE INVENTION

The present invention can include a semiconductor integrated circuit that includes an inductor on a substrate, a first metal layer inside the inductor when viewed from a direction perpendicular to a surface of the substrate, and a lower surface of the first metal layer being no higher than a lower surface of the inductor. In addition, a ferromagnetic substance layer is on the first metal layer. A lower surface of the ferromagnetic substance layer can be lower than an upper surface of the inductor, and an upper surface of the ferromagnetic substance layer being higher than the lower surface of the inductor. A second metal layer can cover an upper and side surface of the ferromagnetic substance layer, and an upper surface of the second metal layer can be no lower than the upper surface of the inductor.

In various embodiments of the present invention, a lamination film can be formed from a first metal layer, ferromagnetic substance layer, and a second metal layer. Such a lamination film can be situated inside the inductor. In such an arrangement, the ferromagnetic substance layer can function as a magnetic core for the inductor, improving an inductance and quality factor (Q-factor) of the inductor.

In addition, in such a lamination film, the ferromagnetic substance layer can be covered with the first and second metal layers. Thus, the material of the ferromagnetic substance layer can be prevented from out diffusing into other regions of the semiconductor integrated circuit and/or contaminating a manufacturing system that could be sensitive to such a material.

Still further, a lower surface of a ferromagnetic substance layer can be made lower than an upper surface of an inductor, and an upper surface of the ferromagnetic substance layer can be made higher than the lower surface of the inductor. Thus, at least a portion of the ferromagnetic substance layer can be at the same level as the inductor. This can improve the inductance and Q-factor of the inductor.

Yet further, a lower surface of the lamination film can be equal to, or lower than the lower surface of the inductor, and an upper surface of the lamination film can be equal to or higher than an upper surface of the inductor. Consequently, there can be essentially no parasitic capacitance between the upper and lower surfaces of the lamination film, and the inductor. This can also improve the inductance and Q-factor of the inductor.

According to one aspect of the embodiments, a ferromagnetic substance layer can be divided into a plurality of parts that are separated from one another when viewed from the direction perpendicular to a surface of the substrate. Such an arrangement can suppress the flow of eddy currents in the ferromagnetic substance layer. This can control loss of inductance that could otherwise occur due to such eddy currents.

According to another aspect of the embodiments, a semiconductor integrated circuit may also include a multilayer interconnection layer on the substrate. The inductor and a laminated film are formed on an uppermost layer of the multilayer interconnection layer. The laminated film can comprise the first metal layer, the ferromagnetic substance layer, and the second metal layer.

According to another aspect of the embodiments, the inductor, first metal layer and second metal layer can comprise a metal selected from the group consisting of copper and aluminum.

According to another aspect of the embodiments, a ferromagnetic substance layer comprises nickel.

The present invention may also include a semiconductor integrated circuit that includes an inductor on a substrate and a ferromagnetic substance layer that does not overlap the inductor and surrounds a majority of the inductor when viewed from a direction perpendicular to a surface of the substrate. In such an arrangement, a ferromagnetic substance layer can be provided that is not inside, right above, or right below an inductor, but rather surrounding the inductor.

In such an arrangement, a capacitance between the ferromagnetic substance layer and inductor can be reduced as compared to conventional approaches. Further, a flow of eddy currents in the ferromagnetic substance layer can also be reduced. As a result, loss of inductance that could occur from such effects can be reduced. It is also noted that in such a surrounding arrangement, the ferromagnetic substance layer can be in the path of the lines of magnetic force generated by the inductor, despite the fact that the ferromagnetic substance layer is provided on the periphery of the inductor. Thus, such an arrangement does not substantially reduce improvements in inductance provided by the ferromagnetic substance layer, as compared to conventional approaches in which a ferromagnetic substance layer is provided inside an inductor.

According to one aspect of the embodiments, a ferromagnetic substance layer can completely surround and inductor when viewed from the direction perpendicular to the surface of the substrate.

According to another aspect of the embodiments, a semiconductor integrated circuit can further include a multilayer interconnection layer provided on the substrate, and a ferromagnetic substance layer can be formed in a layer selected from the group consisting of the same layer as the inductor and a layer adjacent to the inductor.

The present invention may also include a semiconductor integrated circuit that includes an inductor on a substrate, and a plurality of separate ferromagnetic substance layers. The separate ferromagnetic substance layers can be arranged in a radial fashion around a center area of the inductor on a different level than the inductor.

In the above arrangement, the radial arrangement of separate ferromagnetic substance layers can reduce a capacitance between an inductor and such ferromagnetic substance layers. Further, such separate ferromagnetic substance layers can reduce the flow of eddy currents within a resulting overall ferromagnetic substance layer, comprising the separate ferromagnetic substance layers.

According to one aspect of the embodiments, each ferromagnetic substance layer can have a strip-like shape and be disposed longitudinally in a direction from the center area of the inductor toward a periphery of the inductor.

According to another aspect of the embodiments, a semiconductor integrated circuit can further include a multilayer interconnection layer provided on the substrate. In addition, a ferromagnetic substance layer can be formed in a layer different from, and adjacent to, a layer containing the inductor.

The present invention may also include a semiconductor integrated circuit having an inductor formed on a substrate, an insulator layer that covers the inductor, a ferromagnetic substance layer formed on the insulator layer over a center portion of the inductor, and a conductive pad, formed from a same layer as the ferromagnetic substance layer. The conductive pad is formed in a different region of the semiconductor integrated circuit than the inductor.

In the above arrangement, a ferromagnetic substance layer can be a magnetic core for the inductor. As a result, an inductance and Q-factor of the inductor can be improved. In addition, a ferromagnetic substance layer can be formed in a same layer as a pad, and also be made of the same material as a pad. The same essential process steps can form the ferromagnetic substance layer and the pad. Hence, a special process for forming a magnetic core may be unnecessary, as an existing pad process can be utilized. This can make the manufacture of such a semiconductor integrated circuit simpler, and thus reduce manufacturing costs.

According to one aspect of the embodiments, a ferromagnetic substance layer can cover essentially all of the inductor when viewed from the direction perpendicular to a surface of the substrate.

The present invention may also include a method of manufacturing a semiconductor device. The method can include forming a first metal layer on a substrate, selectively forming a ferromagnetic layer on portions of the first metal layer, forming a second metal layer that covers the ferromagnetic layer, and patterning the first and second metal layers to form a lamination film. The lamination film can include the first metal layer, the ferromagnetic layer, and the second metal layer. The method may also include forming an inductor from at least one of the layers of the lamination film, with the inductor surrounding the lamination film.

According to one aspect of the embodiments, a method may also include, before forming the first metal layer on a substrate, forming a recessed portion in the surface on which the lamination film is to be formed. The recessed portion can have a depth less than the total thickness of the first metal layer and the ferromagnetic layer combined.

The present invention can also include a method of manufacturing a semiconductor device that includes forming an inductor on a substrate, forming an insulator layer that covers the inductor, forming a film of a ferromagnetic substance on the insulator layer, patterning the film of the ferromagnetic substance to form a ferromagnetic substance layer over a central portion of the inductor, and forming a pad from the film of the ferromagnetic substance in a region that is not over the inductor.

BRIEF DESCRIPTION OF THE DRAWINGS

FIG. 4(a) is a cross sectional view taken along line A—A shown in FIG. 1. FIG. 4(b) is a cross sectional view taken along line B—B of FIG. 1.

DETAILED DESCRIPTION OF THE EMBODIMENTS

The present invention will hereinafter be described in more detail on the basis of various particular embodiments and with reference to accompanying drawings.

A first embodiment of the present invention will now be described.

Figure 1:
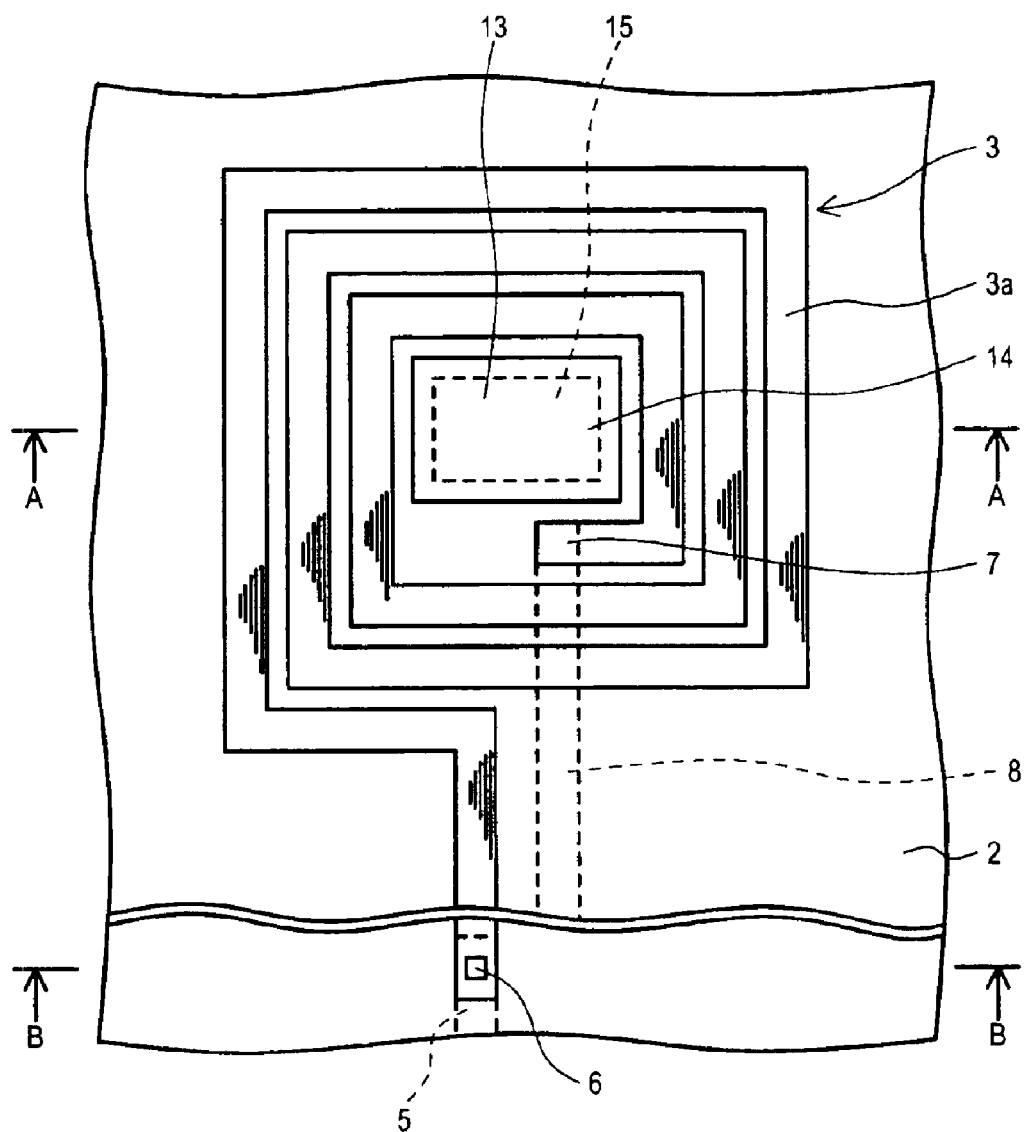
FIG. 1 is a plan view showing a semiconductor integrated circuit according to a first embodiment of the present invention.

FIG. 1 is a plan view showing a semiconductor integrated circuit according to one embodiment. FIG. 2(a) is a cross sectional view taken along line A—A of FIG. 1. FIG. 2(b) is a cross sectional view taken along line B—B of FIG. 1.

As shown in FIGS. 1, 2(a) and 2(b), in a semiconductor device according to a first embodiment, a multilayer interconnection layer 1 can be provided on a semiconductor substrate (not shown). A multilayer interconnection layer 1 can be formed by laminating a plurality of layers, and can include an uppermost insulating layer 2. An inductor 3 can be a spiral inductor formed on insulating layer 2. In particular, an inductor 3 can be formed by arranging a wiring 3a into a spiral shape (vortex shape).

By way of example, an insulating layer 2 can have a thickness of about 1.5 micro-meters (μm). Inductor 3 can have a square shape, with outer sides having a length of about 100 μm. Inductor 3 can also have an internal form in the shape of a square, with sides having a length of about 40 to 60 μm. A width of a wiring 3a can be in the range of about 5 to 10 μm, and the number of turns in inductor 3 can be three.

It is noted that in FIG. 2(a), for the sake of convenience, only two wirings 3a are shown for each side of inductor 3. In addition, an insulating layer 4 is provided that underlies insulating layer 2. Each of insulating layers 2 and 4 can be formed from silicon dioxide ($SiO_2$), for example.

In addition, a wiring 5 can be provided that is embedded in a region of insulator layer 2 that is apart from inductor 3. A via 6 can be formed in insulating layer 2 in a region above wiring 5. One end of wiring 3a can be distributed from an outer side of inductor 3 to via 6, and can be connected to wiring 5 by way of via 6. Still further, a via 7 can be formed through insulating layer 2 at a region within inductor 3. Another end of wiring 3a can be connected to a wiring 8 distributed in layer lower than the inductor 3 by way of via 7. That is, connections to an inductor 3 can be provided in the following order: wiring 5, via 6, outer end of wiring 3a vortex, inner end of wiring 3a vortex, via 7, and wiring 8.

Each of wirings 3a, 5 and 8 can be formed by laminating a titanium-tungsten (TiW) layer 9, a copper (Cu) layer 10, a Cu layer 11, and a TiW layer 12, in this order, on a lower layer side of an inductor 3. In one particular example, TiW layers 9 and 12 can have a thickness in the range of about 0.05 to 0.10 μm, and Cu layers 10 and 11 can have a thickness in the range of about 0.20 to 0.40 μm. Still further, a film thickness of wirings 3a, 5 and 8 can be in the range of about 0.50 to 1.00 μm.

It is noted that Cu layers 10 and 11 can form a wiring main body layer 17. In addition, TiW layers 9 and 12 can be barrier metals for a wiring main body layer 17. A TiW layer 9 can enhance adhesion between a Cu layer 10 and an insulating layer 2, which can be made from $SiO_2$.

Further, a lamination film 14 can be provided on insulating layer 2, and in an internal region of an inductor 3, i.e., in the inside of the vortex formed by wiring 3a (hereinafter referred to as an internal region 13). As but one example, an internal region 13 can have the general shape of a square with sides of about 40 to 60 μm. A lamination film 14 can be a square within such an internal region 13, and can have the general shape of square with sides of about 30 to 50 μm, for example. A lower surface of lamination film 14 and wiring 3a can be flush with one another, and be in contact with insulating layer 2.

In lamination film 14, a TiW layer 9 and Cu layer 10 are provided to form a lower layer side. Further, a ferromagnetic substance layer 15, such as nickel (Ni), can be provided in a central portion of lamination film 14 on Cu layer 10. An upper and side surface of ferromagnetic substance layer 15 can be covered by Cu layer 11 and TiW layer 12, in that order.

A film thickness of ferromagnetic substance layer 15 can be in the range of about 3 to 5 μm, for example.

The above arrangement results in a lower surface of ferromagnetic substance layer 15 being lower than an upper surface of wiring layer 3a. Further, an upper surface of ferromagnetic substance layer 15 is higher than a lower surface of wiring layer 3a. Consequently, a lower portion of ferromagnetic substance layer 15 can be at the same layer level as wiring layer 3a. In addition, the upper surface of ferromagnetic substance layer 15 can be higher than an upper layer of wiring layer 3a. Thus, the upper surface of lamination film 14 is higher than the upper surface of wiring layer 3a.

Referring still to FIGS. 1, 2(a) and 2(b), an insulating film 16, made of polyimide, for example, can cover inductor 3 and lamination film 14. It is noted that insulating film 16 has been omitted from FIG. 1.

It is also noted that while an inductor may be formed on insulating layer 2, other devices such as transistors can be formed on a semiconductor substrate (not shown).

Of course, while the above embodiment has set forth an inductor in spiral form having three turns, the present invention is not intended to be limited thereto. The number of turns in a spiral wiring may be equal to or larger than four. Conversely, the number of spiral wiring turns may also be equal to or less than two, or even equal to or less than one.

Still further, the particular shape of the inductor set forth in the above embodiments should not be construed as limiting the invention, either. The present invention may include alternate inductor shapes, such as a polygon other than a square, or a circle, as just a few examples. Moreover, the sizes of inductor portions described in the above embodiment should not be construed as limiting the invention thereto. Furthermore, the present invention can employ a ferromagnetic substance layer other than Ni. As but one example, cobalt (Co) could be used as a ferromagnetic substance layer. Along these same lines, a wiring can include electrically conductive materials other than Cu. As but one example, a wiring can include aluminum (Al) as an electrically conductive material. Additionally, the particular insulating materials should not be limited to those of the above embodiments. As but one example, an insulating film 2 may be formed from a silicon oxynitride (SiON).

Next, a method of manufacturing a semiconductor integrated circuit according to an embodiment will be described. FIGS. 3(a) to (e) are cross sectional views for illustrating a method according to one embodiment. The various views can correspond to a portion of the semiconductor device shown in FIG. 2(a).

Referring to FIG. 3(a), a multilayer interconnection layer 1 (shown in FIG. 2(a)) can be formed on a semiconductor substrate. At this time, a wiring 5 (refer to FIG. 2(b)) and a wiring 8 (refer to FIG. 1) can be embedded within insulating layer 2, by etching, for example. In addition, wirings 5 and 8 can be etch stop layers in the formation of vias 6 and 7, respectively. A TiW layer 9 can then be formed over an entire surface of insulating layer 2, by a sputtering method, for example. Next, a Cu layer 10 can be formed on the TiW layer 9 with an electroplating method, for example.

Next, as shown in FIG. 3(b), a resist layer 18 can be formed on Cu layer 10, and an opening portion 18a can be formed through the resist layer 18. The opening portion 18a can correspond to the region in which a ferromagnetic substance layer intended to be formed. A Cu layer 10 can be exposed by opening portion 18a.

Next, as shown in FIG. 3(c), an electroplating of ferromagnetic material can be carried out, with a resist layer 18 serving as a mask. This can form a ferromagnetic substance layer 15 of Ni in the region corresponding to opening portion 18a on Cu layer 10.

Next, as shown in FIG. 3(d), a resist layer 18 can be removed. A Cu layer 11 can then be formed over Cu layer 10 and ferromagnetic substance layer 15. Then, a TiW layer 12 can be formed over a Cu layer 11.

Next, as shown in FIG. 3(e), a resist layer (not shown) can be formed over a TiW layer 12. Then, a TiW layer 12, Cu layer 11, Cu 10, and TiW layer 9 can be selectively removed with a resist layer as a mask, to thereby form a pattern. Such selective removal of the layers may be by wet etching. More particularly, Cu layers 11 and 10 can be removed by wet etching with a sulfuric acid hydrolytic solution formed by mixing sulfuric acid and hydrogen peroxide, for example. The TiW layers 9 and 12 can be removed by wet etching with a hydrogen peroxide solution, for example.

From such a patterning step, a lamination film 14 can be formed that has an essentially square shape when viewed from a direction perpendicular to a semiconductor substrate (i.e., when viewed from a direction perpendicular to insulating layer 2). Further, a wiring 3a can be arranged in a spiral pattern in the periphery of lamination film 14. Such a wiring 3a can be connected to wirings 5 and 8 through vias 6 and 7, respectively.

Lamination film 14 can be formed by laminating TiW layer 9, Cu layer 10, ferromagnetic substance layer 15, Cu layer 11, and TiW layer 12. A wiring 3a can be formed by laminating TiW layer 9, Cu layer 10, Cu layer 11, and TiW layer 12.

An insulating layer 16 of polyimide can be formed over an entire surface of insulating layer 2 to embed lamination film 14 and wiring 3a therein.

In this way, semiconductor integrated circuit can be manufactured according to one embodiment of the present invention.

Figure 2:
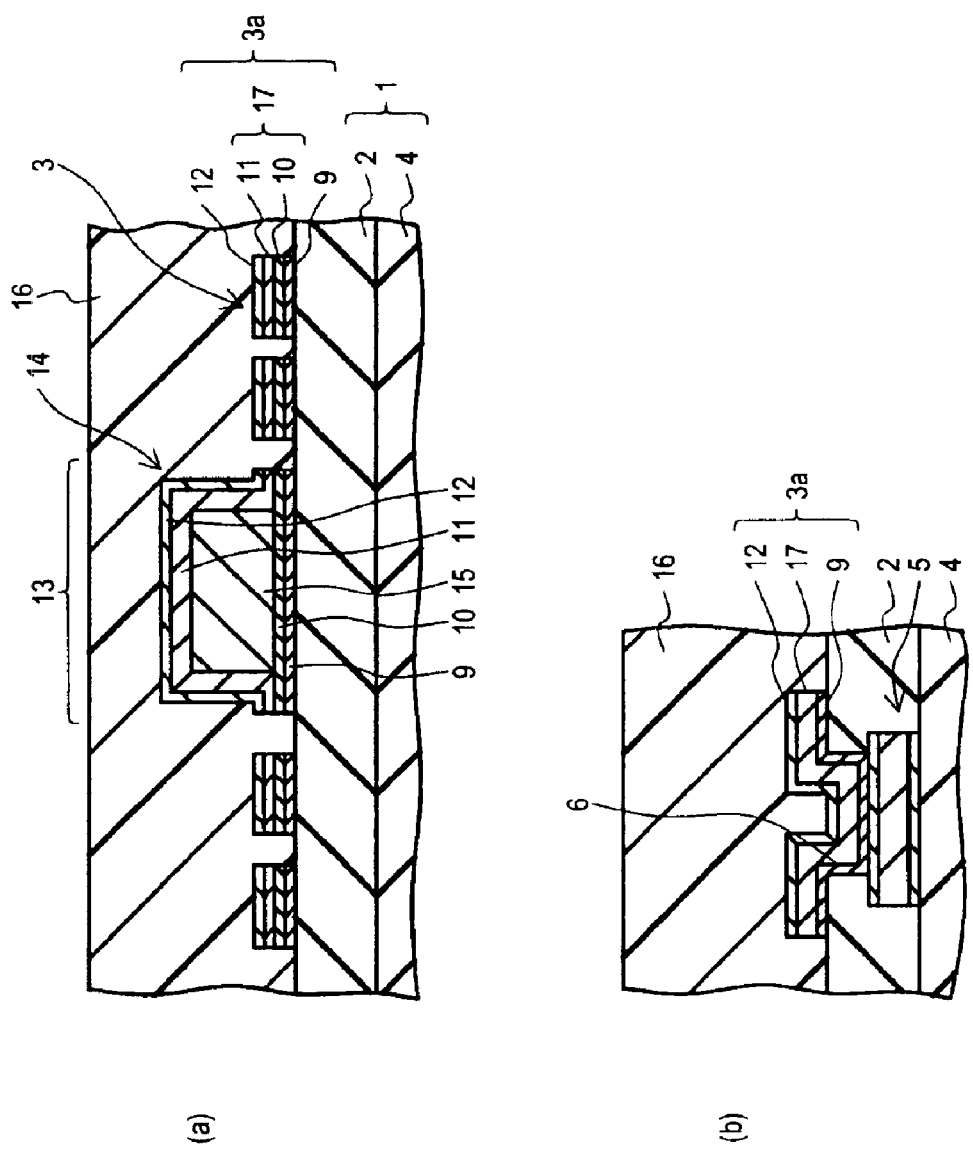
FIG. 2(a) is a cross sectional view taken along line A—A shown in FIG. 1.
FIG. 2(b) is a cross sectional view taken along line B—B of FIG. 1.
Figure 3:
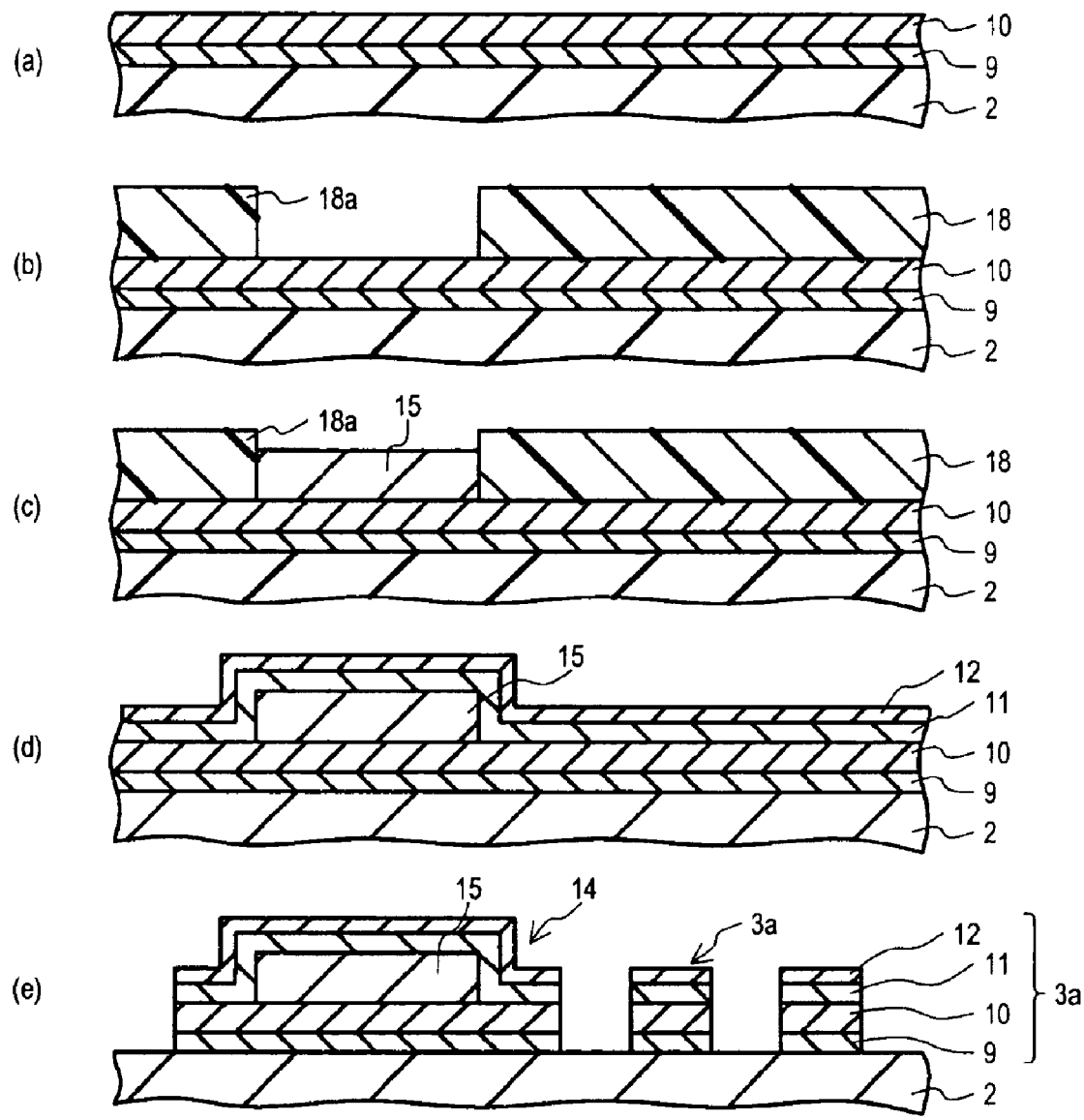
FIGS. 3(a) to 3(e) are cross sectional views showing a method of manufacturing a semiconductor integrated circuit according to an embodiment. The views of FIGS. 3(a) to 3(e) show a portion of FIG. 2(a).
Figure 14:
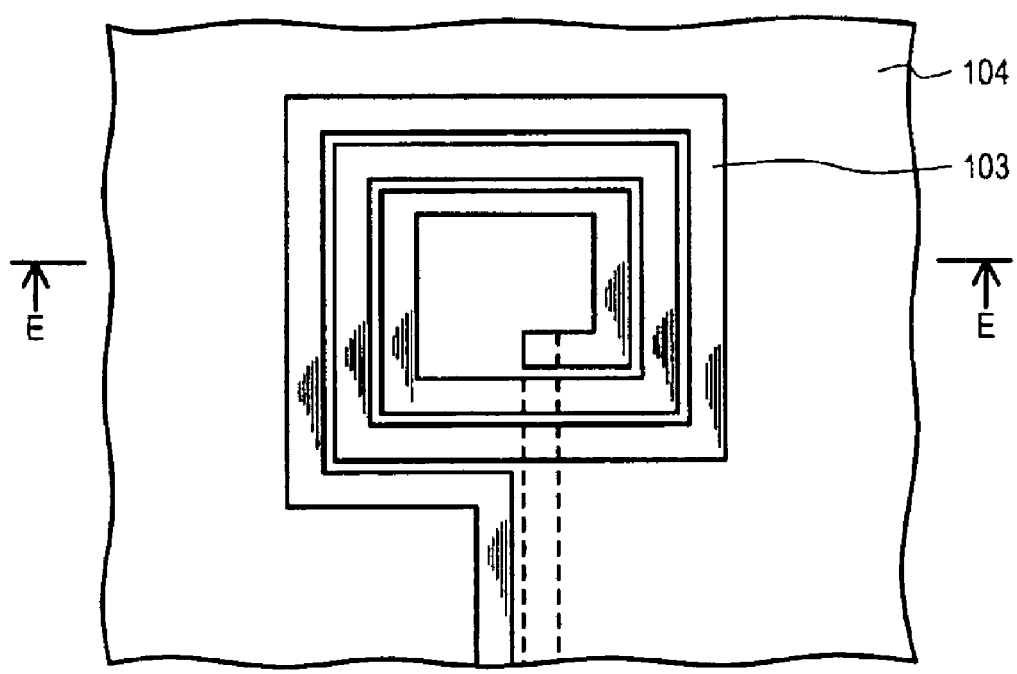
FIG. 14 is a plan view showing a conventional semiconductor integrated circuit.
Figure 15:
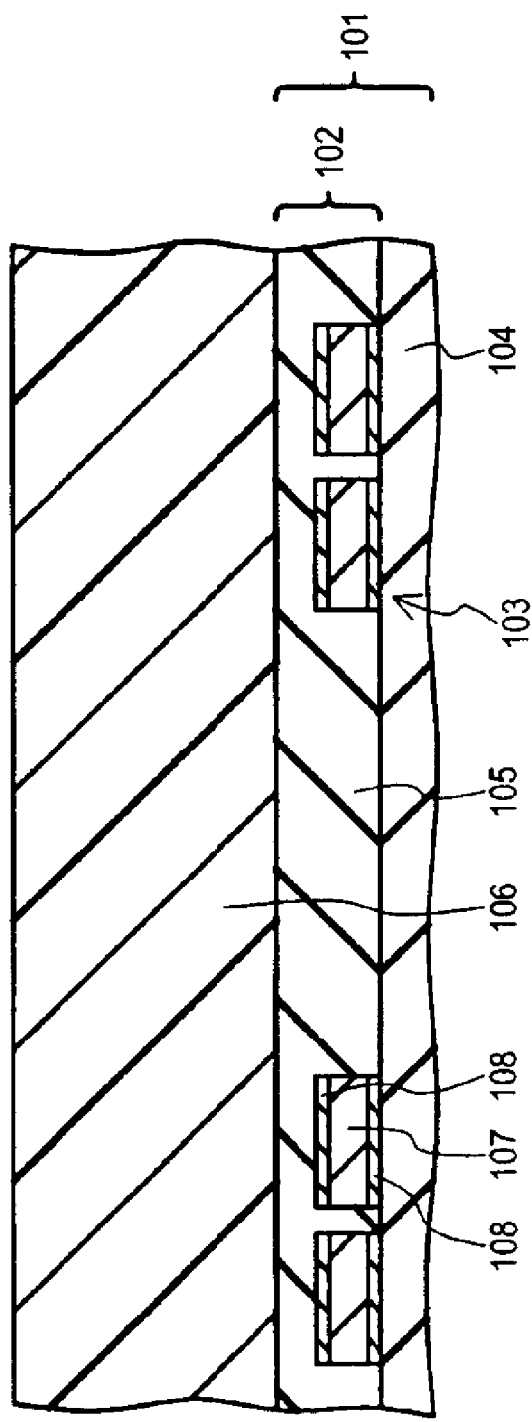
FIG. 15 is a cross sectional view taken along line E—E of FIG. 14.

In the semiconductor integrated circuit of FIGS. 1 to 2(b), and that resulting from the method of FIGS. 3(a) to 3(e), a wiring 3a can be arranged to form a spiral inductor 3. In addition, ferromagnetic substance layer 15 can be provided in an internal region 13 of the inductor 3 and can function as a magnetic core of the inductor 3. This can improve the Q-factor of the inductor 3. The present inventors have found that the semiconductor integrated circuit of the embodiment shown in FIG. 1 can have a Q-factor that is nearly double that of the conventional semiconductor integrated circuit of FIG. 14.

In addition, according to the above embodiments, a ferromagnetic substance layer 15 can be covered with Cu layers 9 and 10, thus the material of the ferromagnetic substance layer 15, in this case Ni, can be prevented from diffusing into other regions of a semiconductor integrated circuit. Further, with such an arrangement, a Ni ferromagnetic material can be prevented from contaminating manufacturing systems used in the manufacturing of the semiconductor integrated circuit.

Moreover, the lower portion of the ferromagnetic substance layer 15 can be formed from the same layer as wiring 3a. This can improve the inductance and Q-factor of the resulting inductor 3. Furthermore, a lower surface of the lamination film 14 can be flush with a lower surface of wiring 3a, and the upper surface of the lamination film 14 is higher than the upper surface of the wiring layer 3a. As a result, there can be essentially no parasitic capacitance between the upper surface and lower surface of the lamination film 14 and wiring 3a. This can also improve the inductance and Q-factor of the resulting inductor 3.

Figure 4:
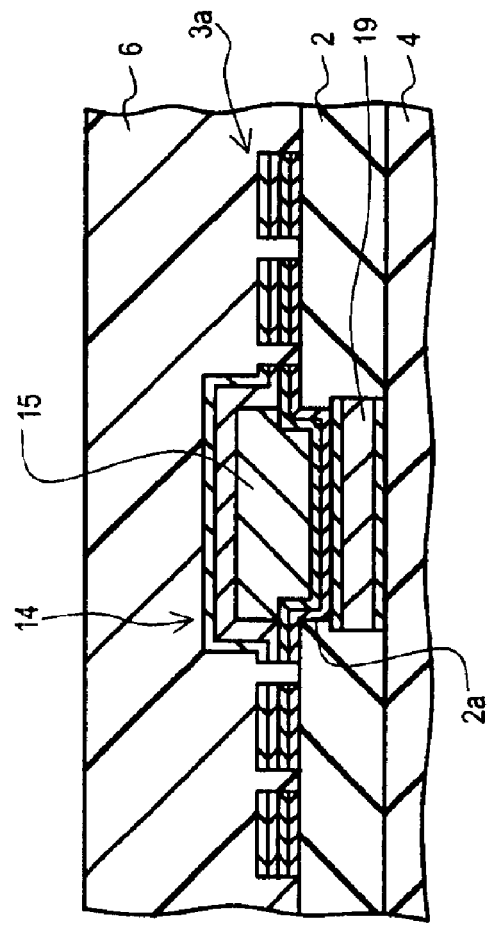
FIGS. 4(a) and 4(b) are cross sectional views showing a method of manufacturing a semiconductor integrated circuit according to a modification of the embodiments shown in FIGS. 1 to 3(e).
Figure 4:
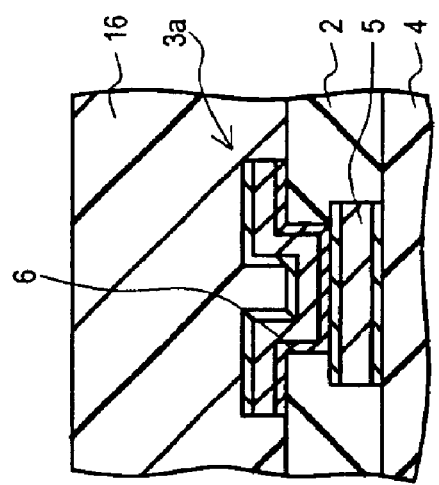

Next, another embodiment will be described that can be a modification of the first embodiment shown in FIGS. 1, 2(a) and 2(b). Thus, a plan view of this embodiment can be essentially the same as FIG. 1. Side cross sectional views of this embodiment are shown in FIGS. 4(a) and 4(b). FIG. 4(a) can correspond to a cross sectional view taken along line A—A shown in FIG. 1. FIG. 4(b) can correspond to a cross sectional view taken along line B—B shown in FIG. 1.

As shown in FIGS. 4(a) and 4(b), a metal layer 19 can be provided in insulating layer 2 in a region just below lamination film 14. In addition, an opening portion 2a can be formed in insulating layer 2 in a region just above metal layer 19. Then, a lower portion of lamination film 14 can be embedded in opening portion 2a.

Metal layer 19 can constitute the same layer as a wiring 5, thus can be made from the same material as that of wiring 5. Metal layer 19 can be formed concurrently with a wiring 5, and an opening 2a can be formed concurrently with vias 6 and 7. In the formation of opening portion 2a, metal layer 19 can be an etching stop layer.

The structure of a semiconductor integrated circuit of this embodiment, other than the foregoing differences, can be same as the above-mentioned first embodiment. Similarly, a method of manufacturing a semiconductor integrated circuit like that shown in FIGS. 4(a) and 4(b), can be the same as that described with reference to FIGS. 3(a) to 3(e), apart from the differences noted above.

In the modified example of FIGS. 4(a) and 4(b), because a lamination film 14 can be formed relatively lower than wiring 3a, as compared with the first embodiment, a larger portion of ferromagnetic substance layer 15 can be in the same layer (e.g., at the same level) as wiring 3a. As a result, the inductance and Q-factor of an inductor 3 can be further improved.

Figure 5:
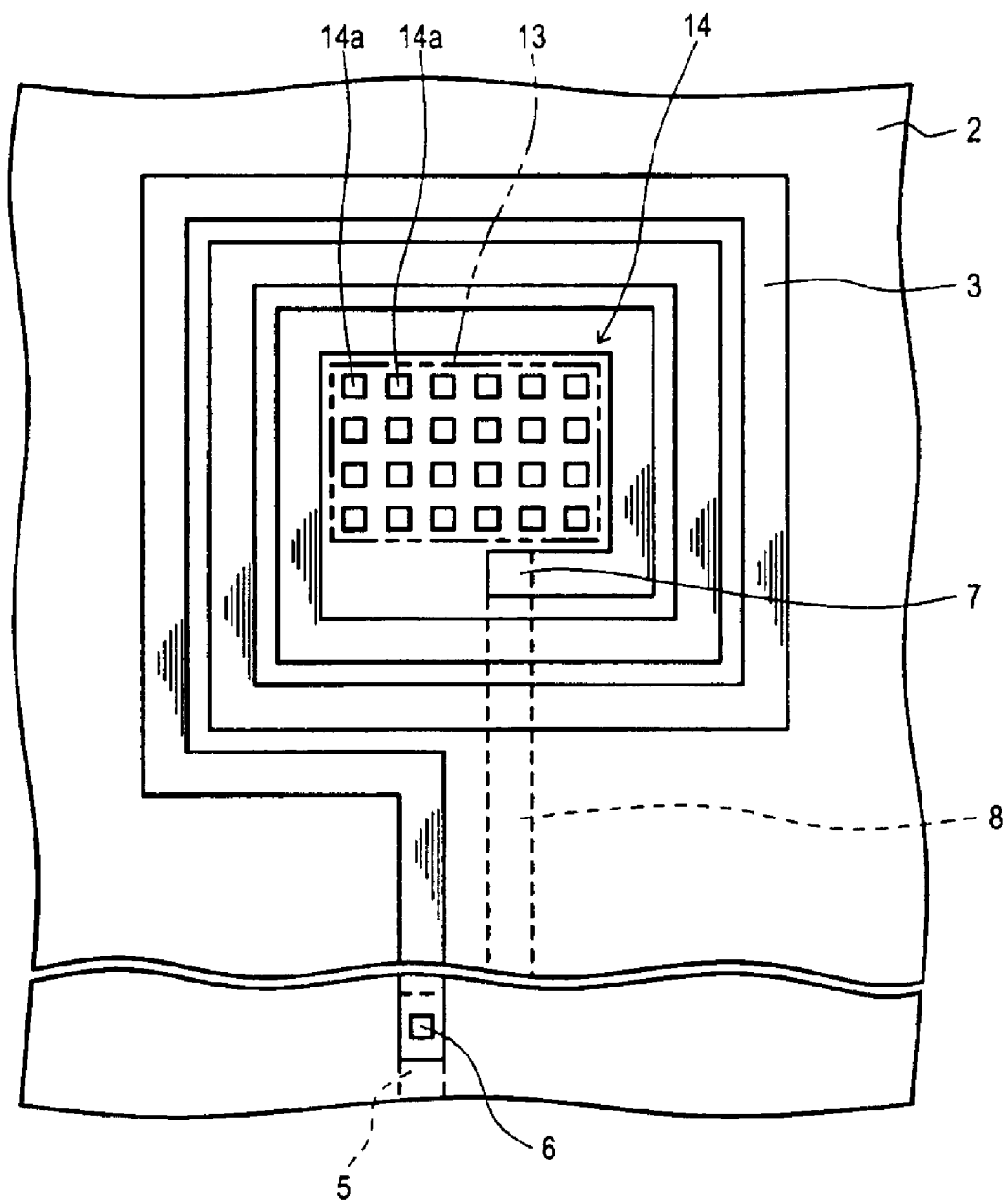
FIG. 5 is a plan view showing a semiconductor integrated circuit according to another embodiment of the present invention.

Another embodiment of the present invention will now be described. FIG. 5 is a plan view of a semiconductor integrated circuit according to this embodiment. As shown in FIG. 5, such a semiconductor integrated circuit can include a lamination film 14 composed of a plurality of separate parts 14a, as compared to the above-mentioned first embodiment. In the particular example of FIG. 5, each of parts 14a can be a rectangle when viewed from a direction perpendicular to the surface of insulating layer 2. Such rectangles can have one side with a length of about 5 to 10 µm. Further, the parts 14a can be arranged in a matrix, for example, within an internal region 13 of inductor 3.

The structure of a semiconductor integrated circuit of this embodiment, other than the foregoing differences, can be same as the above-mentioned first embodiment.

In the embodiment of FIG. 5, because a lamination film 14 is divided into a plurality of parts 14a, as compared to the first embodiment, it is possible to further reduce capacitance between laminated film 14 and wiring 3a. In addition, such an arrangement can suppress the flow of eddy currents within lamination film 14. As a result, the inductance and Q-factor of a resulting inductor 3 can be further improved.

Figure 6:
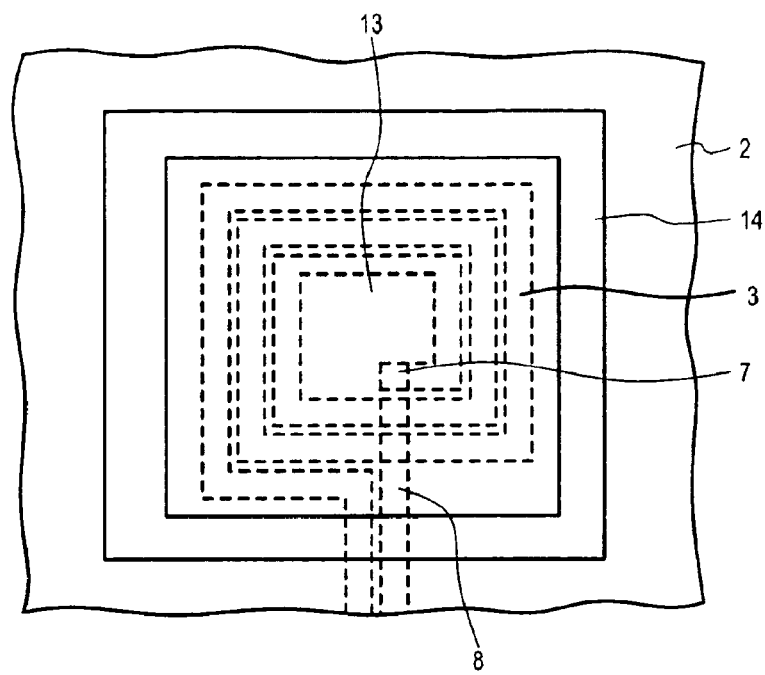
FIG. 6 is a plan view showing a semiconductor integrated circuit according to another embodiment of the present invention.

Another embodiment of the present invention will now be described with reference to FIG. 6. FIG. 6 is a plan view showing a semiconductor integrated circuit. In the embodiment of FIG. 6, an inductor 3 can be embedded in an insulating layer 2, as compared to the first embodiment in which an inductor is formed on an insulating layer 2. Consequently, a via (like that shown in as item 6 in FIG. 1) may not be formed and wiring 3a can be connected at the same level to wiring 5.

In addition, in the arrangement of FIG. 6, a lamination film 14 is not provided in an internal region 13 of an inductor 3. Instead, a lamination film 14 can be provided in a ring-like shape around the periphery of inductor 3, and on insulating layer 2. Thus, lamination film 14 can be conceptualized as surrounding the region right above inductor 3.

The structure of a semiconductor integrated circuit of this embodiment, other than the foregoing differences, can be same as the above-mentioned first embodiment.

It is noted that while the embodiment of FIG. 6 shows a surrounding lamination film 14 above an inductor 3, such a lamination film 14 can be formed below the inductor 3.

In the embodiment of FIG. 6, because a lamination film 14 is provided in the periphery of inductor 3, unlike the first embodiment, it can be possible to further reduce a capacitance between a lamination film 14 and wiring 3a. Further, it may also be possible to suppress eddy current flows within lamination film 14. As a result, a loss of inductance due to such effects can be reduced.

It is also noted that in the arrangement of FIG. 6, even though ferromagnetic substance layer 15 is provided in the periphery of inductor 3, ferromagnetic substance layer 15 remains in the path of the lines of magnetic force generated by inductor 3. Thus, improvements in inductance are not degraded as compared to arrangements in which a ferromagnetic substance layer 15 is provided within internal region 13.

Figure 7:
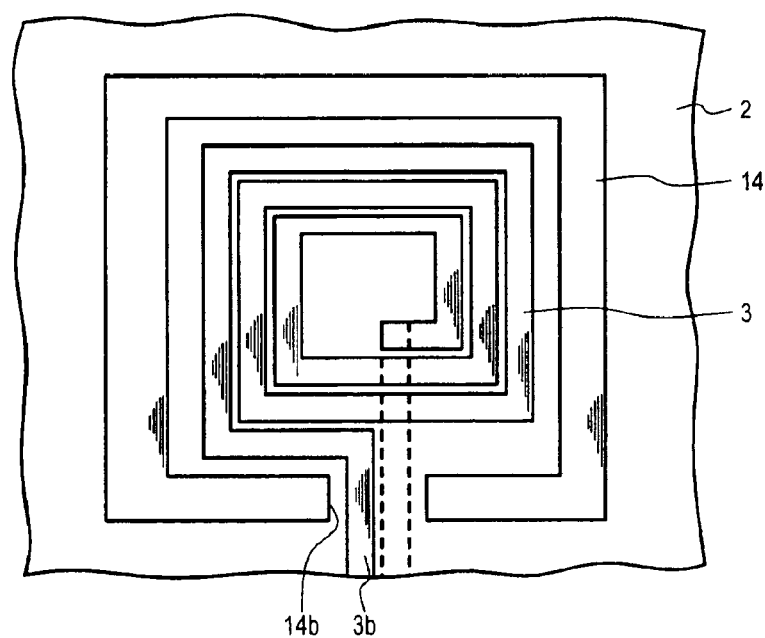
FIG. 7 is a plan view showing a semiconductor integrated circuit according to another embodiment of the present invention.

Another embodiment of the present invention will now be described with reference to FIG. 7. FIG. 7 is a plan view showing a semiconductor integrated circuit. In the embodiment of FIG. 7, a part of lamination film 14 is removed to form a discontinuation portion 14b, as compared to the embodiment of FIG. 6.

Still further, in the embodiment of FIG. 7, inductor 3 may be formed not only in insulating layer 2, but also on insulating layer 2, in a similar fashion as the first embodiment. In such an arrangement, a wiring 3b originating from outside the vortex of inductor 3 may pass through discontinuation portion 14b.

The structure of a semiconductor integrated circuit of this embodiment, other than the foregoing differences, can be same as the above-mentioned first embodiment.

In the embodiment of FIG. 7, because a discontinuation portion 14b is formed in lamination film 14, unlike the embodiment of FIG. 6, circulating eddy currents flowing throughout such a lamination film 14 can be prevented. Thus, losses due to eddy currents can be further reduced to thereby improve the Q-factor of the inductor.

Figure 8:
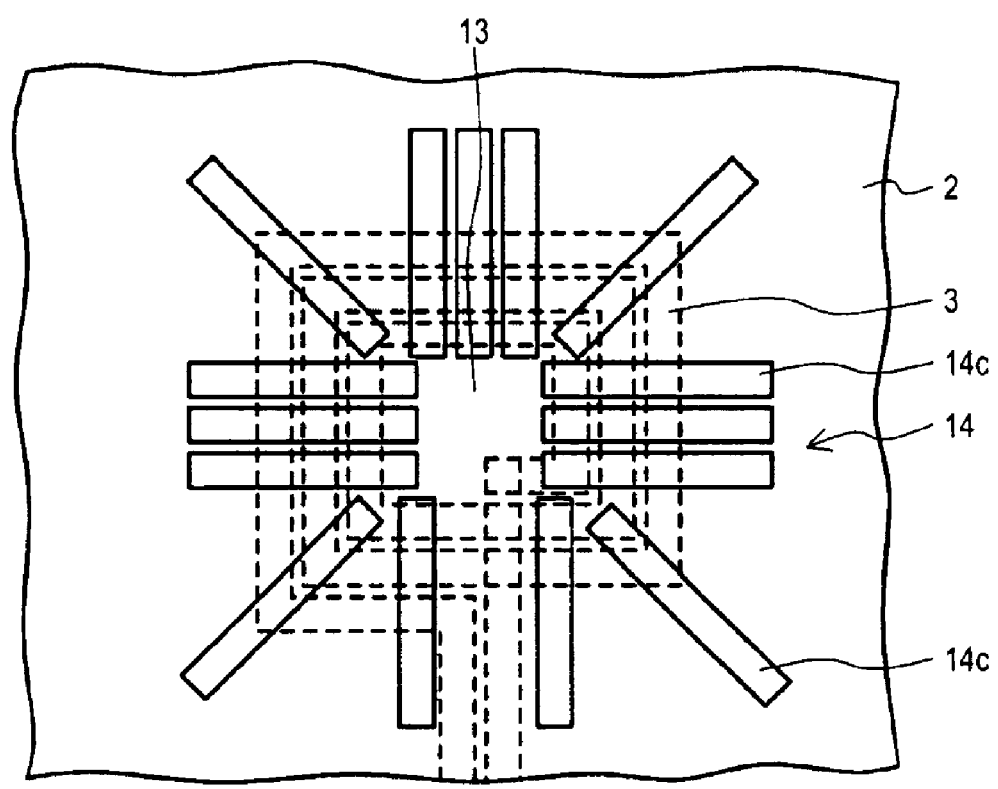
FIG. 8 is a plan view showing a semiconductor integrated circuit according to another embodiment of the present invention.

Another embodiment of the present invention will now be described with reference to FIG. 8. In the embodiment of FIG. 8, like that of FIG. 6, an inductor 3 can be embedded in an insulating layer 2. Unlike FIG. 6, in FIG. 7 a lamination layer 14 can be provided within the internal region 13 of inductor 3. However, lamination layer 14 differs from that of FIG. 6, in that it is formed by a number of separate rectangular portions 14c in a region directly above inductor and in the periphery of the inductor. The lamination layer 14 can be formed on insulating layer 2.

In one arrangement, a width of each rectangular portion 14c can be about 10 µm. Further, in the particular example of FIG. 8, rectangular portions 14c can have a radial arrangement when viewed from a direction perpendicular to the surface of insulating layer 2. As shown, such a radial pattern can include rectangular portions 14c arranged longitudinally along directions extending from a center of spiral inductor 3 toward the periphery thereof.

The structure of a semiconductor integrated circuit of this embodiment, other than the foregoing differences, can be same as the above-mentioned first embodiment.

It is noted that while the embodiment of FIG. 8 shows a lamination film 14 above an inductor 3, such a lamination film 14 can be formed below the inductor 3.

In the embodiment of FIG. 8, because a lamination film 14 is divided into a number of rectangular portions 14c, as compared to the above first embodiment, a capacitance between lamination film 14 and wiring 3a can be reduced. Also, since a lamination film 14 of FIG. 8 is intermittently arranged about a circumference of inductor 3, eddy currents within such a lamination film 14 can be suppressed. As a result, a loss of inductance from such effects can be reduced.

Figure 9:
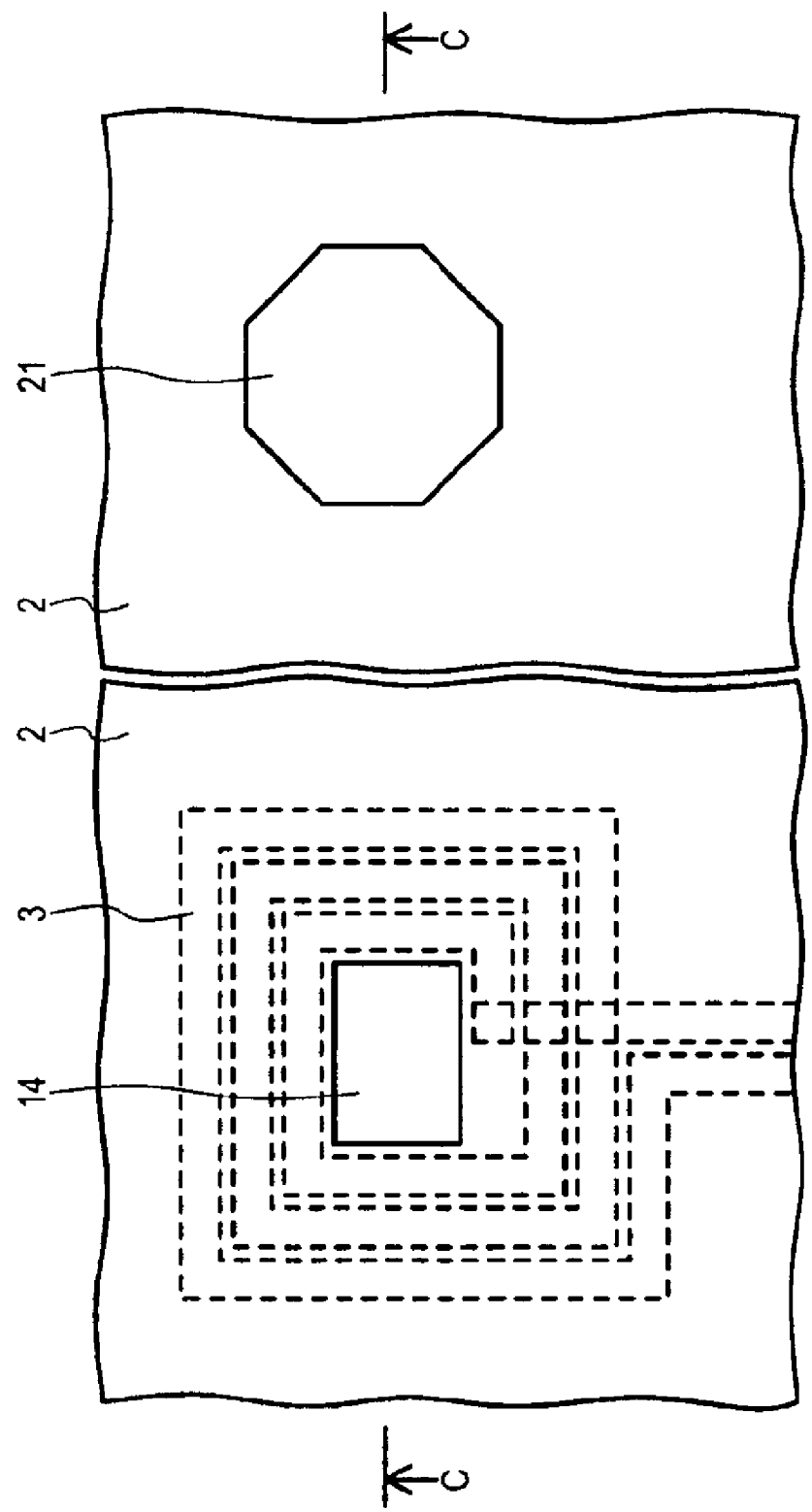
FIG. 9 is a plan view showing a semiconductor integrated circuit according to another embodiment of the present invention.
Figure 10:
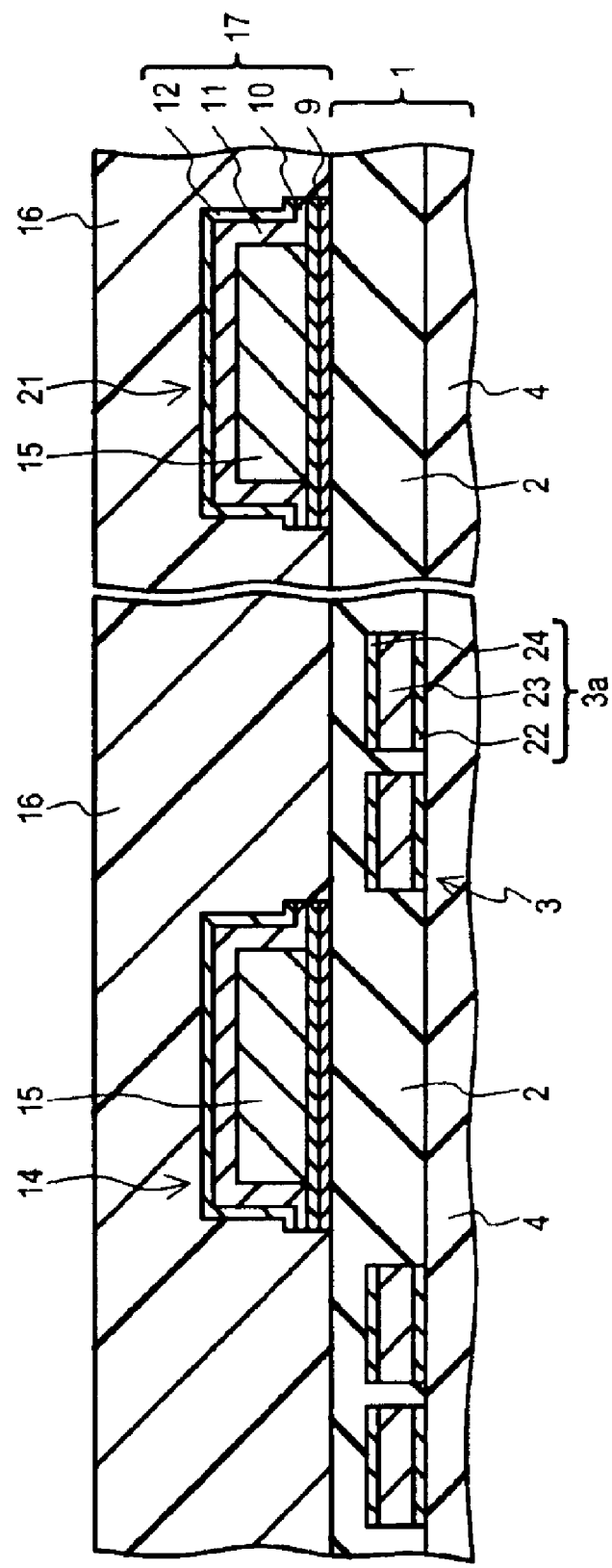
FIG. 10 is a cross sectional view taken along line C—C of FIG. 9.
Figure 11:
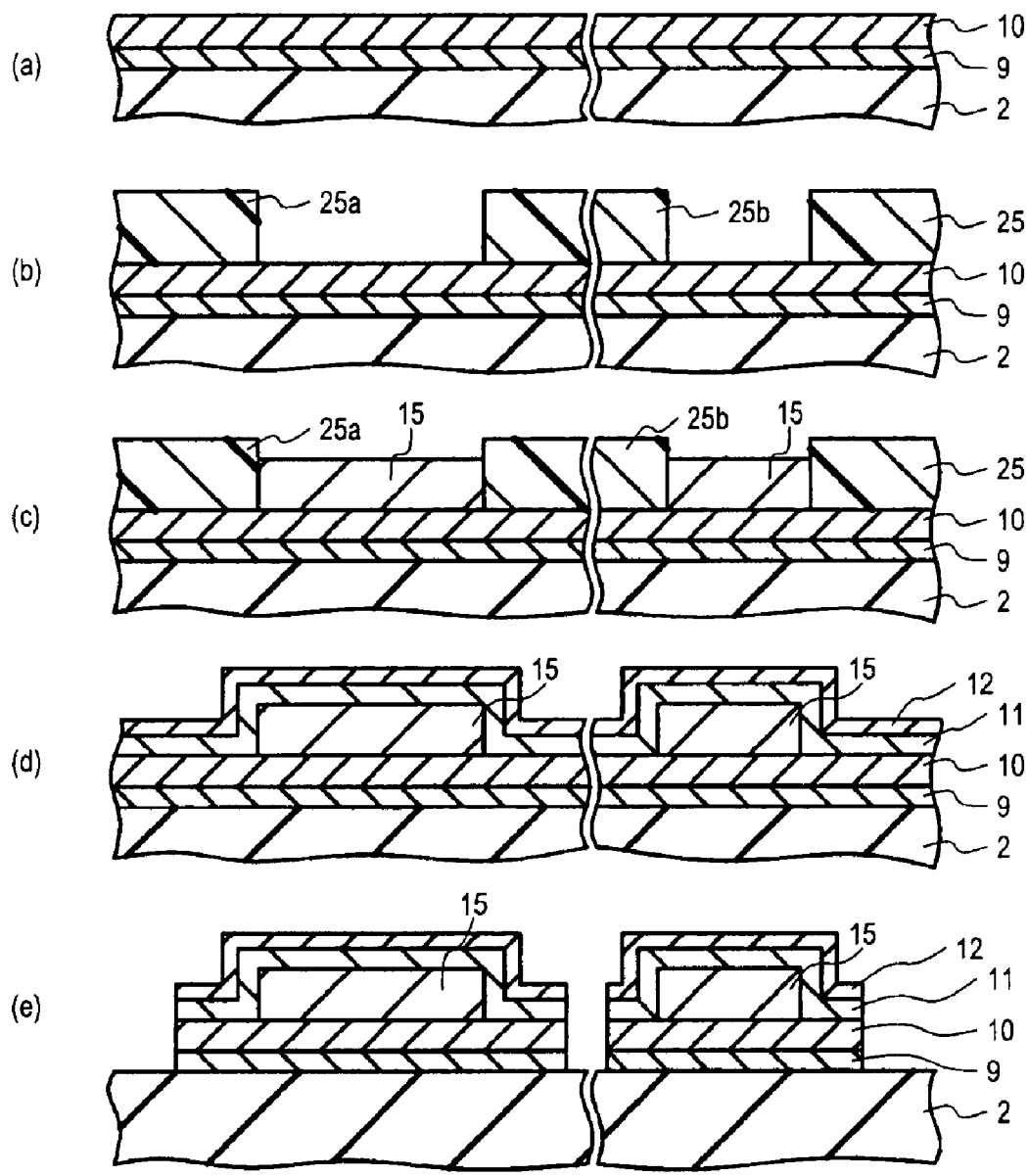
FIGS. 11(a) to 11(e) are cross sectional views showing a method of manufacturing a semiconductor integrated circuit according to an embodiment.

Another embodiment of the present invention will now be described with reference to FIG. 9. FIG. 9 is a plan view showing a semiconductor integrated circuit according to this embodiment. FIG. 10 is a cross sectional view taken along line C—C of FIG. 9. As shown in FIGS. 9 and 10, in a semiconductor integrated circuit of this embodiment, a multilayer interconnection layer 1 is provided on a semiconductor substrate (not shown).

A multilayer interconnection layer 1 can be formed by laminating a number of layers. An inductor 3 can be a spiral inductor formed in insulating layer 2, which can be an uppermost layer of multilayer interconnection layer 1. An inductor 3 can be formed by arranging one wiring 3a in a spiral shape (vortex). In the arrangement of FIGS. 9 and 10, a wiring 3a can be formed by laminating a TiW layer 22, a Cu layer 23, and a TiW layer 24, in that order. As in the first embodiment, in FIGS. 9 and 10 the number of turns in the inductor 3 is three. For sake of convenience, only two turns are shown in FIG. 10, for each side.

As also shown in FIGS. 9 and 10, a lamination film 14 can be provided above an internal region 13 of inductor 3, and situated on insulating layer 2. A lamination film 14 can have the same essential structure as the lamination film of the first embodiment.

In addition, a pad 21 can be formed in a region apart from that of inductor 3. Pad 21 can be formed on insulating layer 2. Such a pad 21 can be a connection point for a "flip-chip" bump, or the like. A pad 21 can have an octagon shape, for example, when viewed from a direction perpendicular to the surface of the insulating layer 2. An outer diameter of such a pad 21 can be about 100 μm, as but one example. A pad 21 can be formed in a similar fashion as lamination film 14. That is, a pad 21 can be formed by laminating TiW layer 9 and Cu layer 10. A ferromagnetic substance layer 15, of Ni for example, can be laminated on a central portion of Cu layer 10. The upper and side surface of ferromagnetic substance layer 15 can then be covered with a Cu layer 11 and a TiW layer 12. That is to say, a pad 21 can be formed from the same layer as lamination film 14.

Next, a method of manufacturing a semiconductor device, like that of FIGS. 9 and 10, will be described with reference to FIGS. 11(a) to 11(e).

Referring to FIG. 11(a) in conjunction with FIG. 10, a multilayer interconnection layer 1 can be formed on a semiconductor substrate. At this time, a TiW layer 22, Cu layer 23, and TiW layer 24 are laminated, in that order, on insulating layer 4. Such a laminated layer can then be patterned to form a spiral wiring 3a. As a result, a spiral inductor 3 can be formed on insulating layer 4. Insulating layer 4 can be made of SiO$_2$, for example. An insulating layer 2, also made of SiO$_2$ for example, can be formed on insulating layer 4, to thereby embed inductor 3 therein.

Referring still to FIG. 11(a), a TiW layer 9 can be formed over an entire surface of insulating film 2 with a sputtering method, for example. Next, a Cu layer 10 can be formed on the TiW layer 9 utilizing an electroplating method, as but one example.

Next, as shown in FIG. 1(b), a resist layer 25 can be formed on Cu layer 10. Opening portions 25a and 25b can be formed through the resist layer 25. Opening portion 25a can correspond to the region in which a ferromagnetic substance layer 15 of a laminated film 14 intended to be formed. Opening portion 25b can correspond to the region in which a ferromagnetic substance layer 15 of a pad 21 is intended to be formed. A Cu layer 10 can be exposed through opening portions 25a and 25b.

Next, as shown in FIG. 11(c), an electroplating of ferromagnetic material can be carried out, with a resist layer 25 serving as a mask. This can form a ferromagnetic substance layer 15 of Ni, for example, in the regions corresponding to opening portions 25a and 25b on Cu layer 10.

Next, as shown in FIG. 11(d), a resist layer 25 can be removed. A Cu layer 11 can then be formed over Cu layer 10 and ferromagnetic substance layer 15. Then, a TiW layer 12 can be formed over a Cu layer 11.

Next, as shown in FIG. 11(e), a resist layer (not shown) can be formed over a TiW layer 12. Then, a TiW layer 12, Cu layer 11, Cu 10, and TiW layer 9 can be selectively removed with such a resist layer as a mask, to thereby form a pattern. Such selective removal of the layers may be with wet etching. More particularly, Cu layers 11 and 10 can be removed by wet etching with a sulfuric acid hydrolytic solution formed by mixing sulfuric acid and hydrogen peroxide, as one example. The TiW layers 9 and 12 can be removed by wet etching with a hydrogen peroxide solution, as one example.

From such a patterning step, as shown in FIG. 9, a lamination film 14 can be formed that has an essentially square shape when viewed from a direction perpendicular to a semiconductor substrate (i.e., when viewed from a direction perpendicular to insulating layer 2). In addition, a pad 21 can be formed that has an octagonal shape when viewed from such a direction. Lamination film 14 and pad 21 can be formed by laminating TiW layer 9, Cu layer 10, ferromagnetic substance layer 15, Cu layer 11, and TiW layer 12.

An insulating layer 16 (see FIG. 10) of polyimide can be formed over an entire surface of insulating layer 2 to embed lamination film 14 and pad 21 therein.

In this way, semiconductor integrated circuit can be manufactured according to another embodiment of the present invention. The structure of the above embodiment and corresponding manufacturing method, apart from the differences noted above, can be the same as the embodiments shown in FIGS. 1 to 3(e).

In the above examples shown in FIGS. 9 to 11(e), a wiring 3a is spirally arranged to form a spiral inductor. Ferromagnetic substance layer 15 can be provided in the internal region 13 of inductor 3 to function as a magnetic core. This can allow an inductance and Q-factor of inductor 3 to be improved.

Still further, in the example of FIGS. 9 to 11(e), a lamination film 14 and pad 21 can be formed with the same process. Thus, lamination film 14 and pad 21 can be formed in the same layer as that of pad 21 and can be made of the same materials. Consequently, a special process for forming a lamination film 14 is unnecessary. As a result, the manufacture of semiconductor integrated circuit according to the embodiments may be simplified, and manufacturing costs may be reduced.

Figure 12:
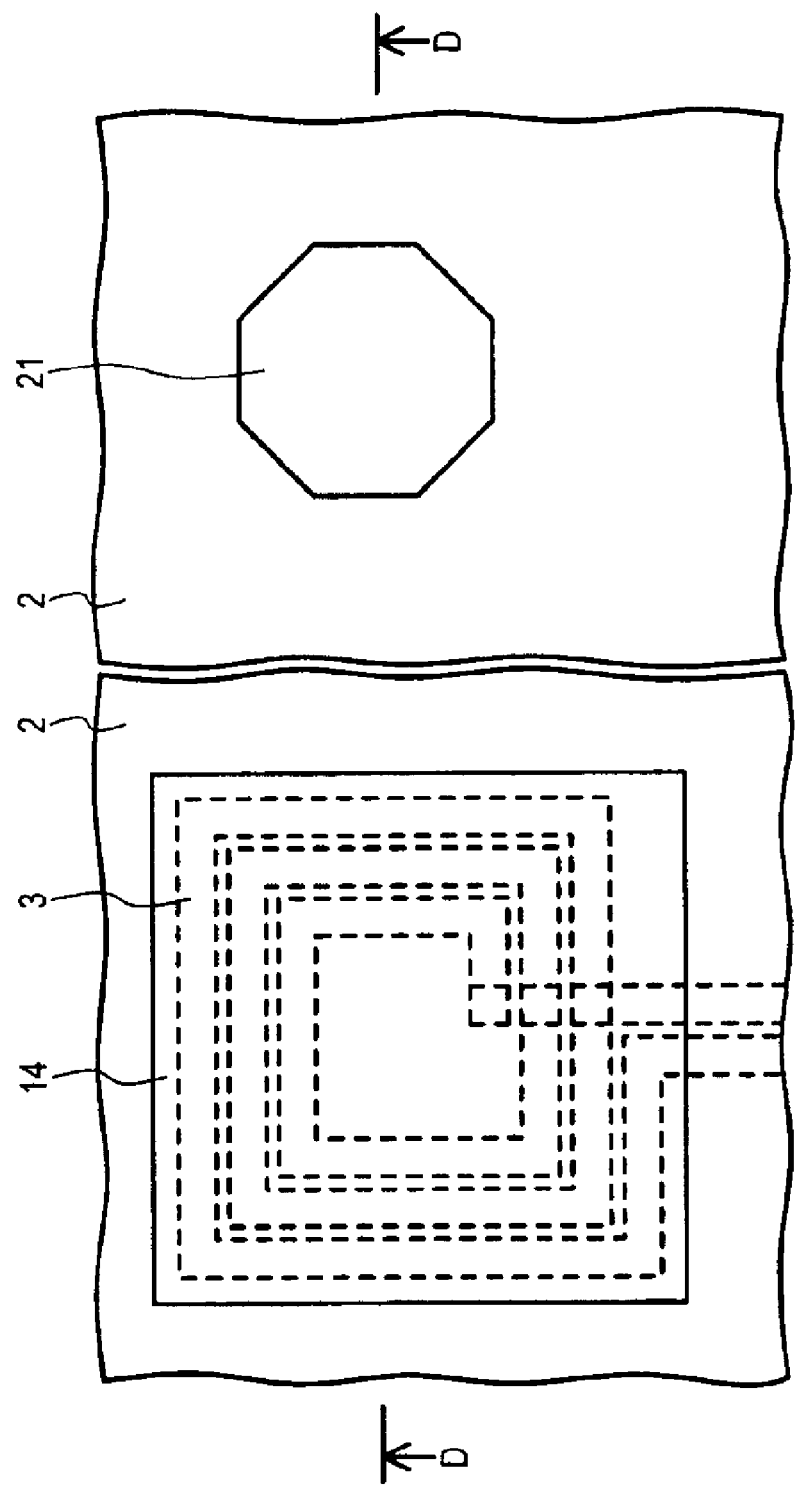
FIG. 12 is a plan view showing a semiconductor integrated circuit according to another embodiment of the present invention.
Figure 13:
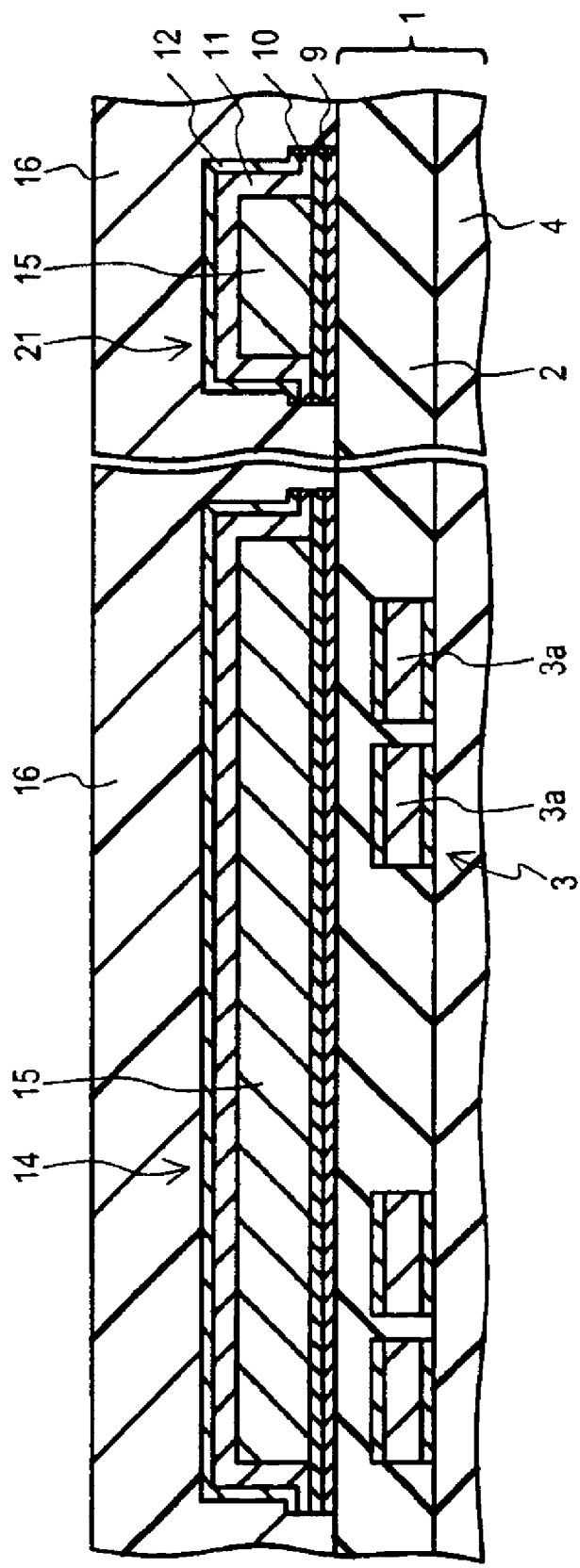
FIG. 13 is a cross sectional view taken along line D—D of FIG. 12.

Another embodiment of the present invention will now be described with reference to FIGS. 12 and 13. FIG. 12 is a plan view showing a semiconductor integrated circuit according to this embodiment. FIG. 13 is a cross sectional view taken along line D—D shown in FIG. 12.

As shown in FIGS. 12 and 13, a semiconductor integrated circuit according to this embodiment can differ from that of the embodiments shown in FIGS. 9 to 11(e) in that a lamination film 14 can be formed, not only over an internal region of an inductor 3, but also over an entire region above inductor 3. That is, a lamination film 14 can be formed so that inductor 3 is covered with a lamination film 14 when viewed from a direction perpendicular to the surface of insulating layer 2.

The structure of the above embodiment and corresponding manufacturing method, apart from the differences noted above, can be the same as the embodiments shown in FIGS. 9 to 11(e).

In the above embodiment of FIGS. 12 and 13, even if an inductor 3 is reduced in size (miniaturized), it is still possible to provide a ferromagnetic substance layer 15 of sufficient size. In addition, it is noted that if no lamination film 14 were provided, then current flowing in inductor would be concentrated on a lower surface of the inductor 3 (e.g., the semiconductor substrate side) due to the "skin" effect. However, because this embodiment includes a lamination film 14 over the whole region above an inductor 3, in operation current can flow through an upper surface as well, thereby reducing a resistance value of inductor 3. As a result, a Q-factor of the inductor 3 can be further improved.

As has been described above, according to some embodiments of the present invention, a lower surface of a ferromagnetic substance layer can be made lower than an upper surface of an inductor wiring. Further, an upper surface of a ferromagnetic substance layer can be made higher than a lower surface of an inductor wiring. In such an arrangement, at least a portion of ferromagnetic substance layer can be at the same level (layer) as the inductor wiring. This can allow an inductance and a Q-factor of a spiral inductor to be improved.

Further, in the present invention, a lower surface of the lamination film can be made equal to or lower in level than a lower surface of an inductor wiring, and an upper surface of a lamination film can be made equal to or higher than an upper surface of the wiring. Consequently, essentially no parasitic capacitance can be present between the upper and lower surface of the lamination film, and the wiring. This can allow an inductance and Q-factor of a spiral inductor to be further improved.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor integrated circuit, comprising:
   an inductor on a substrate;
   a first metal layer inside the inductor when viewed from a direction perpendicular to a surface of the substrate, a lower surface of the first metal layer being no higher than a lower surface of the inductor;
   a ferromagnetic substance layer on the first metal layer, a lower surface of the ferromagnetic substance layer being lower than an upper surface of the inductor, an upper surface of the ferromagnetic substance layer being higher than the lower surface of the inductor; and
   a second metal layer that covers an upper and side surface of the ferromagnetic substance layer, an upper surface of the second metal layer being no lower than the upper surface of the inductor.

2. The semiconductor integrated circuit of claim 1, wherein:
   the ferromagnetic substance layer is divided into a plurality of parts that are separate from one another when viewed from the direction perpendicular to a surface of the substrate.

3. The semiconductor integrated circuit of claim 1, further including:
   a multilayer interconnection layer on the substrate; and
   the inductor and a laminated film are formed on an uppermost layer of the multilayer interconnection layer, the laminated film comprising the first metal layer, the ferromagnetic substance layer, and the second metal layer.

4. The semiconductor integrated circuit of claim 1, wherein:
   the inductor, first metal layer and second metal layer comprise a metal selected from the group consisting of copper and aluminum.

5. The semiconductor integrated circuit of claim 1, wherein:
   the ferromagnetic substance layer comprises nickel.

6. A semiconductor integrated circuit, comprising:
   an inductor on a substrate; and
   a laminated film beside the inductor wherein
   the laminated film having a ferromagnetic substance layer and a metal layer covering the ferromagnetic substance layer to prevent diffusion of the ferromagnetic substance layer.

7. The semiconductor integrated circuit of claim 6, wherein:
   the laminated film formed inside the inductor when viewed from a direction perpendicular to a surface of the substrate.

8. The semiconductor integrated circuit of claim 7, wherein:
   the ferromagnetic substance layer is divided into a plurality of parts separated from one another when viewed from a direction perpendicular to a surface of the substrate.

9. The semiconductor integrated circuit of claim 6, wherein:
   the laminated film is free from overlapping the inductor and surrounds the inductor when viewed from a direction perpendicular to a surface of the substrate.

10. The semiconductor integrated circuit of claim 6, furthering including:
    a multilayer interconnection layer on the substrate wherein the inductor and the laminated film are formed in different layers of the multilayer interconnection layer from each other.

11. The semiconductor integrated circuit of claim 10, wherein:
    the laminated film is divided into a plurality of parts separated from one another; and
    the parts are arranged in a radial fashion around a center area of the inductor.

12. The semiconductor integrated circuit of claim 11, wherein:
    each of the parts has a strip-like shape and is disposed longitudinally in a direction from the center area of the inductor toward a periphery of the inductor.

13. The semiconductor integrated circuit of claim 10, further including:

a pad formed in a same layer as the laminated film.

14. The semiconductor integrated circuit of claim 13, wherein:

the pad has the same laminated structure as the laminated film.

15. The semiconductor integrated circuit of claim 10, wherein:

the laminated film covers essentially all of the inductor when viewed from a direction perpendicular to a surface of the substrate.

16. A semiconductor integrated circuit comprising:

an inductor on a substrate:

a laminated film beside the inductor wherein the laminated film having a ferromagnetic substance layer and a metal layer covering the ferromagnetic substance layer to prevent diffusion of the ferromagnetic substance layer; and the metal layer having a first layer and a second layer; and a lower surface of the ferromagnetic substance layer is covered with the first layer and an upper surface and a side surface of the ferromagnetic substance layer is covered with the second layer.

17. The semiconductor integrated circuit of claim 16, wherein:

the inductor having a laminated structure of the first layer and the second layer.

18. The semiconductor integrated circuit of claim 16, wherein:

each of the first layer and the second layer includes a barrier metal layer.

19. A semiconductor integrated circuit comprising:

an inductor on a substrate;

a laminated film beside the inductor wherein the laminated film having a ferromagnetic substance layer and a metal layer covering the ferromagnetic substance layer to prevent diffusion of the ferromagnetic substance layer; and the metal layer includes a barrier metal layer.

20. A semiconductor integrated circuit comprising:

an inductor on a substrate;

a laminated film beside the inductor wherein the laminated film having a ferromagnetic substance layer and a metal layer covering the ferromagnetic substance layer to prevent diffusion of the ferromagnetic substance layer; and a multilayer interconnection layer on the substrate wherein the inductor and the laminated film are formed on an uppermost layer of the multilayer interconnection layer.

* * * * *